United States Patent [19]
Bauer et al.

[11] Patent Number: 5,654,579
[45] Date of Patent: Aug. 5, 1997

[54] ELECTRONIC COMPONENT

[75] Inventors: Norbert Bauer, Erlangen; Friedrich Böbel, Uttenreuth; Hermann Haken, Stuttgart, all of Germany

[73] Assignee: Fraunhofer Gesellschaft zur Forderung der angewandten Forschung e.V., Munich, Germany

[21] Appl. No.: 424,451

[22] PCT Filed: Oct. 29, 1993

[86] PCT No.: PCT/DE93/01039

§ 371 Date: Jun. 16, 1995

§ 102(e) Date: Jun. 16, 1995

[87] PCT Pub. No.: WO94/10755

PCT Pub. Date: May 11, 1994

[30] Foreign Application Priority Data

Oct. 29, 1992 [DE] Germany .................. 42 36 644.5

[51] Int. Cl.⁶ .................. H01L 45/00; H03K 19/23; H03K 19/14; G06G 7/00
[52] U.S. Cl. .................. 257/443; 257/21; 257/189; 257/431; 257/439
[58] Field of Search .................. 257/21, 189, 439, 257/443, 431

[56] References Cited

U.S. PATENT DOCUMENTS 4,961,096  10/1990  Idesawa .................. 257/431
5,093,803  3/1992   Howard et al. .................. 364/807
5,220,445  6/1993   Takenaka et al. .................. 257/431

FOREIGN PATENT DOCUMENTS 0266811  5/1988  European Pat. Off. .
0273306  7/1988  European Pat. Off. .................. 257/431

OTHER PUBLICATIONS

Mazzola et al, *Appl. Phys Lett* vol. 59 No. 10 2 Sep. 1991 "Analysis . . . Grafts Photoconductor".
Haken "*Synergetic Computers and Recognition*" 1991 Springer Verlaa, Berlin pp. 56–59.

*Primary Examiner*—Jerome Jackson
*Attorney, Agent, or Firm*—Antonelli, Terry, Stout & Kraus, LLP

[57] ABSTRACT

Described is an electronic component with N input terminals, which admit N input signals, M output terminals, each of which is assigned to one or more input terminals, a component body in which, depending on the input signals, current paths or filaments are created which connect the N input terminals with the M output terminals, wherein, to establish a decision or displacement dynamics, an external quantity applied to the component switches the current flow through the component body between an initial distribution, in which the current densities ($j_i$) between each input terminal and its assigned output terminal correspond to the input signal admitted at the respective input terminal, and a self-organizing distribution, in which the current flows only between the input terminal admitting the input signal with the highest value and its assigned output terminal.

15 Claims, 1 Drawing Sheet

ELECTRONIC COMPONENT

TECHNICAL FIELD

The present invention relates to an electronic component.

STATE OF THE ART

In numerous image processing methods, e.g., in morphological methods such as erosion and dilation filtering, in image norming, in pattern detection, pattern completion as well as in classification, the concept of "the winner take all" plays a decisive role. This means that from a number of numerical values, always the largest value is taken. These numerical values may be already preprocessed and/or reduced data, such as is usually the case in a classification, or raw data, like those being present in filtering original images.

In the use of new signal and image processing methods, e.g., with the aid of neuronal networks, "the winner take all" is an important concept as well. Thus, the decision as to which neuron has the largest value is made at the output of a back-propagation network.

The principle "the winner take all" is also the decisive function principle of synergetic computers: The concept of synergetic computers was developed by H. Haken and collaborators (H. Haken, Synergetic Computers and Cognition, Springer Verlag, Berlin, 1991) and is distinguished by very high performance in the fields of pattern detection, pattern completion and classification. Furthermore, it is suited for monitored and unmonitored learning.

A synergetic computer is essentially composed of two modules.

In the first module, the raw data are preprocessed, e.g., the image data are prepared to be invariant, referring to translation, rotation and scaling, and are allocated to so-called order parameters by comparison with stored prototypes.

The second module subjects the order parameters to a decision or displacement dynamics, in which the initially strongest order parameter is predominating, i.e. converging toward 1, whereas all other order parameters become 0. Here, the principle of "the winner take all" applies as well.

A component, i.e., a device, which filters out the largest value amongst the many parallel input signals present and, in particular, filters out the largest value of those signals representing order parameters, as quickly as possible, would be a very valuable component for a synergetic computer but also for other processes that employ the principle "the winner take all" mentioned in the introduction. A component that realizes these decision principles on the hardware side is hitherto not known.

DESCRIPTION OF THE INVENTION

It is a main objective of the present invention to provide a component that filters out on the hardware side the input signal with the initially largest value from a number of parallel input signals, with the output signals belonging to the remaining ones of the parallel input signals becoming zero.

An invention which achieves this objective is set forth in the appended claims.

The component (or device) according to the present invention is provided with a component body with N input connections to which (up to) N input signals can be applied, and M output connections of which each is allocated to one or multiple input connections. Current paths, respectively current filaments, connecting the N input connections to the M output connections initially are formed in dependence on the input signals in the component body.

In order to realize decision respectively displacement dynamics, an external physical effect applied to the component switches the current flowing through the component body between the initial distribution, in which the current density ($j_i$) between each input connection and the respective output connection correspond to the input signal applied to the respective input connection, and a self-organizing distribution, in which the current still only flows between the input connection, to which the input signal with the largest value is applied, and its respective output connection(s).

The invention is directed to a component which, by way of illustration, can be utilized to realize a synergetic computer, because it itself works according to synergetic, i.e., self-organizing principles. This, component is, therefore, referred to hereinafter as synistor.

The external physical effect applied to the component can be, in particular, an operation voltage applied directly to the component body for setting the initial distribution and for setting the self-organizing distribution via a circuit, which effects a small voltage drop at the semiconductor element, as, e.g., a controllable protective resistor. For switching, other physical effects, however, such as magnetic fields, electric fields, etc., may, of course, also be employed.

In any event, it is preferred if, for realization of a synistor of this type, a physical effect observed in doped semiconductors whose charge transport is primarily caused by collision ionization is used. By way of example, with regard to this physical effect reference is made to "Appl. Phys. Lett. 59 (10), 1991, pp. 1182 to 1184. However, it is explicitly pointed out that there are other suited materials beside the ones mentioned in this article.

In the case of these physical effects, whose occurrence initiate charge transport essentially by collision ionization, types of operation can be found, notably, in which the current does not flow through the entire semiconductor crystal; but rather regions are formed in which the current density j is relatively large as well as regions for which j=0 holds. Due to Switching, by way of illustration, a suited protective resistor, competition sets in between the individual current filaments.

An element of the present invention is that it was understood that the subsequently proceding decision dynamics adhere to the laws of synergy and, therefore, can be utilized for realizing a synergetic computer. Thus, the initially strongest element predominates; this means that, after the decision dynmics have converged, the entire current flows through a single filament whilst there is no current flowing through all the other regions of the semi-conductor. This effect may also be understood as decision making, classification, filtering, etc. As previously mentioned herein, the synistor selects the largest value from a number of values. These values may be single pixel or, e.g., correlations between an input image and various stored images (so-called prototypes).

In order for the synistor to operate as a classifier, in most cases a preprocessing in the sense of synergetic computer theory is required which draws the so-called order parameters from the raw data (e.g., an input image) by comparing them with the stored information (e.g., prototypes). The synistor then picks out the largest order parameter ("the winner take all").

The input image is then allocated to the prototype belonging to the remaining current filament and thus classified. No preprocessing is necessary in the case of erosion/dilation filtering, because minimum and maximum operations are conducted directly on the image data.

In general, all the preprocessing steps conducting a transformation of raw data into order parameters belong to the first module of the synergetic computer. The synistor already needs as input values order parameters which are only in exceptional cases directly available from the raw data.

The possibility of drawing on synergetic mechanisms opens totally new paths in the circuit development:

By way of illustration, a synistor can compare thousands of order parameters with each other within some 10 nano seconds and in this manner can make a decision within a time that is approximately $10^3$ to $10^5$ times shorter than is the case with currently the latest generation of high-performance computers or image processing hardware.

The component (or device) according to the present invention is distinguished by the following performance features:

High potential integration density:

The theoretical border for the filament density lies at approximately $10^{10}$ filaments per $cm^2$. The velocity advantage over conventional electronic components rises linearly with integration density.

Simple manufacturing:

A synistor is essentially composed of a thin layer of semiconductor material which, preferably, is doped for collision ionization. More complex methods of manufacturing are required only in coupling in the initial conditions (e.g., via light) or coupling the connecting lines.

High computing velocity:

The time required for the course of the decision dynamics usually amounts to a few 10 ns to 100 ns.

BRIEF DESCRIPTION OF THE DRAWINGS

The present invention is made more apparent in the following using preferred embodiments with reference to the illustrations depicted in.

DESCRIPTION OF PREFERRED EMBODIMENTS

Figure 1:
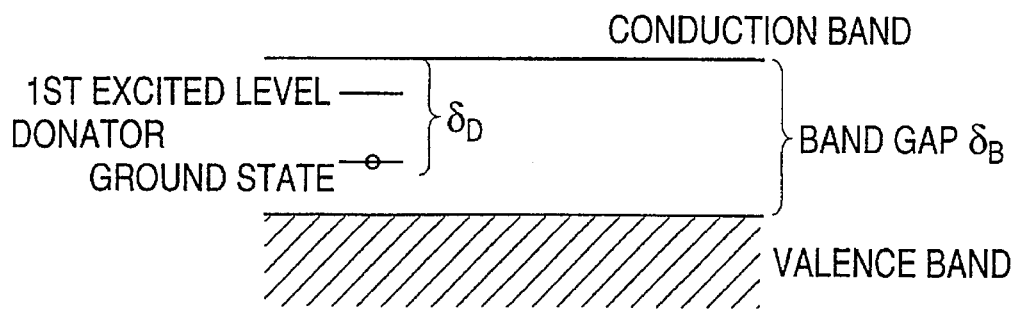
FIG. 1 shows the band gap of a semiconductor.

A synistor is based on self-organizing mechanisms like those occuring in charge transport due to collision ionization in semiconductors. FIG. 1 shows the band gap of a semiconductor (e.g., Si, Ge, NaAs, CdTe, Diamant, SiC, etc.), including the ground state and the first excited level of a donor. Thermal transitions, respectively transitions due to collision ionization as well as recombination, occur.

Important for the function capability of the synistor is the condition that very many more electrons are raised from the donator ground state into the conduction band by collision ionization than by thermal excitation. This means that the energy gap between the donor ground state and the conduction lower edge $\delta_D$ has to be at least 5 to 10 times greater than the thermal excitation energy $k_BT$ ($k_B$=Boltzmann constant=$1.38*10^{-23}$ J/K).

Valid for room temperature is: $k_BT$=0.0259 eV. Therefore, for uncooled synistor operation, only deep donors come into consideration. Some possible combinations are listed in Table 1, with the data drawn from the book by S. M. Sze, Physics of Semiconductor Devices, John Wiley & Sons, 1981. Cooling partially up to 4.2K is required when using flat traps. However, only operation voltages of a few mV are still needed for this. In any event, low concentrations of doping materials are required (usually: $10^{14}$–$10^{16}$ atoms per $cm^3$) and compensations of 0.4 to 0.8.

TABLE 1

Some semiconductor materials and favorable doping materials for manufacturing synistors that can be operated at room temperature.

| Material Combination | Energy Difference Between the Donor Ground State and the Conduction Band Lower Edge $\delta_D$ |
|---|---|
| Si/Se | 0.40 eV |
| Si/Ta | 0.43 eV |
| Si/Fe | 0.51 eV |
| Si/K | 0.35 eV |
| Ge/Se | 0.28 eV |
| Ge/Te | 0.30 eV |
| GaAs/O | 0.67 eV |
| GaAs/Se | 0.53 eV |

Assuming that the condition $\delta_D$>5 $k_BT$ is met, the current-voltage characteristic of a semiconductor element doped in this manner shows an S-shaped curve course, which is typical of the formation of the current filaments, i.e. the semiconductor element can be subdivided into regions in which the current density j is relatively large and into regions in which there is no current flow (j=0).

Figure 2:
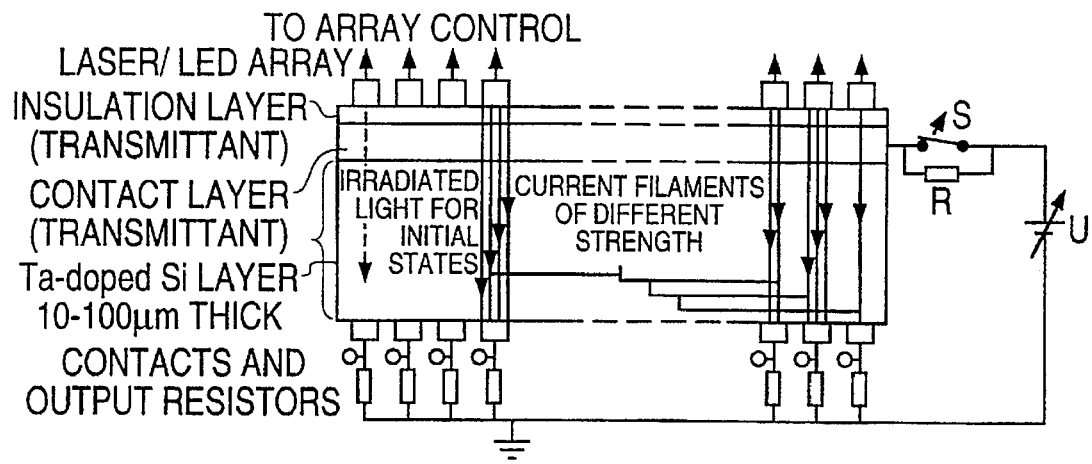
FIG. 2 shows the geometric dimensions and the formation of the filaments

FIG. 2 shows the geometric dimensions and the formation of the current filaments in a schematic diagram. The number of current lines symbolizes their different strengths.

The present invention is based on understanding that by connecting a protective resistor R between the filaments, competition and displacement competition occur, and this displacement competition adheres to synergetic laws, i.e., the displacement dynamics can be described by a synergetic potential. With regard to the term synergetic potential, reference is made to the book by H. Haken "Synergetic Computer and Cognition", Springer Verlag, Berlin, 1991, to which, moreover, reference is made for all details not made more apparent herein. At the end of displacement competition, the entire current flows through the intitially stronger current filament.

In other words:

The synistor is a hardware realization of the "the winner take all" concept which plays an important role not only in synergetic computers, but also in image processing (e.g., erosion/dilation filters) and neuroelectronics.

In order to be able to utilize the synistor for computation purposes, concerted initial conditions have to be implemented which correspond exactly to the order parameters of a synergetic computer, i.e., the number of current filaments and their strength correspond to the number of order parameters and their value. This may occur electronically and optically. In an electronic case, a site-independent voltage distribution U(x,y) would be applied to the surface of the synistor in such a manner that current filaments of different strength form by collision ionization. In an optical case, locally different densities of the conduction electrons are generated by an inhomogenous light distribution the wave length of which corresponds to an energy which is greater than $\delta_D$ and which results in the formation of current filaments of different strength. In an electronic case, the strength of the filament depends on the magnitude of the voltage $U_{s,y}(x,y)$, in an optical case on the irradiated intensity. Inhomogenous optical light distributions can be easily generated with surface-emitting laser arrays which are directly connected to the synistor. Short laser pulses already suffice for implementation of the initial state. Of course, all physical effects can also be utilized for generation of the input voltage distribution $U_{s,y}(x,y)$, the physical effects such as pressure (piezoelectric effect), temperatures (thermoelectric effect), etc. can be turned into voltage so that a synistor can be utilized directly for further processing of, e.g., tactile signals. The displacement dynamics proceed very quickly. Typical time constants are approximately 50–100 ns.

For the attainable integration and, therefore, also for the calculating performance of a synistor, the relationship between the thickness of the filaments and the thickness of their walls (i.e. the region in which the current density drops practically exponentially) is the decisive criterium. The rule of the thumb is that filaments whose thickness is less than 4 times the wall thickness collapse. The wall thickness is given by the Debye length $L_D$, with typical values for $L_D$ being about 10 nm (with regard hereto reference is made to E. Schöll's book, Nonequilibrium Phase Transistions in Semiconductors, Springer Verlag, Berlin, 1987).

As a result, for a minimum filament size of 60 nm (40 nm thickness plus 2*10 nm wall thickness) and in the event a distance of 40 nm between it and its neighbor is included, an integration density of $10^{10}$ filaments per cm$^2$ is yielded. The currently possible filament size is approximately 5 µm thus integration densities of about $10^6$ filaments/cm$^2$ can be attained. A 1 cm$^2$-sized synistor can therefore conduct morphological operations within an image having 512*512 pixels in=0.1 µs, which is approximately a factor of $10^5$ faster than is the case with current image processing hardware.

FIG. 2 shows the diagram of a synistor having optical coupling in. A laterally inhomogenous intensity distribution is coupled in into an approximately 50 µm thick Ta-doped silicon layer by a laser or LED array. Thus, it is necessary that the contact layer is transmittant. Furthermore, the photon energy of light irradiated is larger than $\delta_D=0.43$ eV and smaller than the silicon band gap of $\delta_D=1.14$ eV. If the operation voltage U lies above 1V, an inhomogenous current filament distribution is formed, its strength corresponding exactly to the light distribution. Opening switch S connects the competition in such a manner that after approximately 50 to 100 ns, the entire current flows through the initially strongest current filament. Consequently, only voltage at the respective output resistor still drops, providing information about the strongest input signal.

Legend 1 donator
2 initial excited level
3 ground state
4 conduction band
5 valence band
6 band gap
7 laser LED array
8 array triggering
9 insulation layer (transmittant)
10 Ta-doped Si-layer 10–100 µm thick
11 contacts and output resistors
12 irradiated light for initial conditions
13 current filaments of different strength
14 contact layer (transmittant)

What is claimed is:

1. An electronic component comprising:
    N input connections to which N input signals are applied, where N is a positive integer;
    M output connections each of which is allocated to one or multiple input connections, where M is a positive integer, said N input connections and said M output connections being provided on opposite sides of said electronic component; and
    a component body in which current paths, provided as current filaments, arise in dependence on the input signals, said current paths connecting respective ones of said M output connections to one or more of said N input connections,
    wherein said component body is made of a semiconductor material in which electron excitation into the conduction band occurs primarily by means of collision ionization, and
    wherein a protective resistor is connected in front of said component body, said protective resistor contributing to the realization of a decision or displacement dynamics, by which an external physical effect applied to said component switches the current flowing through said component body between (i) an initial distribution, in which the current densities ($j_i$) effected between each input connection and a respective output connection correspond to the input signal applied to the respective input connection, and (ii) a self-organizing distribution in which the current only still flows between said input connection to which the input signal having the largest value is applied and the respective output connection.

2. A component according to claim 1, wherein said external physical effect applied to said component is an operation voltage which is applied directly to said component body and which is for setting said self-organizing distribution via a circuit which effects a small voltage drop at the semiconductor element, said circuit being inclusive of an adjustable protective resistor.

3. A component according to claim 1 or 2, wherein said input connections are arrayed on one side of said component body and said output connections are arrayed on another, opposing side of said component body.

4. A component according to claim 1, wherein said semiconductor material is doped with donors in which the energy gap $\delta_D$ between the donor ground state and the conduction band lower edge is substantially larger than the thermal excitation energy $k_B T$ ($k_B$: Boltzmann constant).

5. A component according to claim 4, wherein said energy gap $\delta_D$ is at least larger than said thermal excitation energy $k_B T$ by a factor of 5.

6. A component according to claim 4 or 5, wherein for a room-temperature-operated component, silicon is utilized as said semiconductor material and Se, Ta, K or Fe is utilized as said donor material.

7. A component according to claim 4 or 5, wherein for a room-temperature-operated component, germanium is utilized as said semiconductor material and Se, or Te is utilized as said donor material.

8. A component according to claim 4 or 5, wherein for a room-temperature-operated component, GaAs is utilized as said semiconductor material and Se, Ta or Te is utilized as said donor material.

9. A component according to claim 1, wherein said N input signals are applied as input voltages to said input connections.

10. A component according to claim 4 or 5, wherein said input signals are applied to a LED or laser diode array which irradiates the semiconductor body with an inhomogenous light distribution corresponding to said input signals and the photon energy of which is greater than said energy gap $\delta_D$.

11. A computer circuit unit in which a preprocessing module generates, from sensor signals provided by a reception sensor array, order parameters which are evaluated by a circuit operating according to the synergetic principle, wherein said circuit is constituted by a component according to one of claims 1, 2, 4, 5 or 9.

12. A computer circuit unit according to claim 11, wherein said sensor array is a photodiode array or an array having pressure-sensitive or temperature-sensitive elements.

13. A computer circuit unit according to claim 12, wherein said preprocessing module includes two modules of which the first one makes said input signals translation invariable, rotation invariable and scale invariable, and the second one generates said order parameters by comparison with prototype images.

14. A computer circuit unit according to claim 11, wherein said preprocessing module includes two modules of which the first one makes said input signals translation invariable, rotation invariable and scale invariable, and the second one generates said order parameters by comparison with prototype images.

15. A component according to claim 1, wherein said external physical effect applied to said component is an operation voltage which is applied directly to said component body and which is for setting said self-organizing distribution via a circuit which effects a small voltage drop at the semiconductor element.

* * * * *